(12) United States Patent
Hossain et al.

(10) Patent No.: US 9,112,026 B2
(45) Date of Patent: Aug. 18, 2015

(54) SEMICONDUCTOR DEVICES AND METHOD OF MAKING THE SAME

(71) Applicant: Semiconductor Components Industries, LLC, Phoenix, AZ (US)

(72) Inventors: Zia Hossain, Tempe, AZ (US); Juraj Vavro, Piestany (SK); Peter Moens, Zottegem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/654,143

(22) Filed: Oct. 17, 2012

(65) Prior Publication Data

US 2014/0103421 A1   Apr. 17, 2014

(51) Int. Cl.
 *H01L 29/66* (2006.01)
 *H01L 29/78* (2006.01)
 *H01L 29/06* (2006.01)

(52) U.S. Cl.
 CPC ........ *H01L 29/7827* (2013.01); *H01L 29/0634* (2013.01); *H01L 29/0688* (2013.01); *H01L 29/0619* (2013.01)

(58) Field of Classification Search
 CPC ............... H01L 29/7813; H01L 21/76202; H01L 29/7395
 USPC .............. 257/329, 509, 139, 332, E29.018, 257/E21.544, E29.262, E29.198
 See application file for complete search history.

(56) References Cited

U.S. PATENT DOCUMENTS

| | | | |
|---|---|---|---|
| 6,204,097 B1 | 3/2001 | Shen et al. | |
| 6,274,904 B1 | 8/2001 | Tihanyi et al. | |
| 6,300,171 B1 | 10/2001 | Frisina | |
| 6,410,958 B1 * | 6/2002 | Usui et al. | 257/329 |
| 6,621,122 B2 * | 9/2003 | Qu | 257/339 |
| 6,639,260 B2 | 10/2003 | Suzuki et al. | |
| 6,674,126 B2 | 1/2004 | Iwamoto et al. | |
| 6,677,626 B1 | 1/2004 | Shindou et al. | |
| 6,982,193 B2 | 1/2006 | Hossain et al. | |
| 7,176,524 B2 | 2/2007 | Loechelt et al. | |
| 7,253,477 B2 | 8/2007 | Loechelt et al. | |
| 7,285,823 B2 * | 10/2007 | Loechelt et al. | 257/341 |
| 7,411,266 B2 | 8/2008 | Tu et al. | |
| 7,655,981 B2 | 2/2010 | Lee et al. | |
| 7,759,204 B2 | 7/2010 | Hshieh et al. | |
| 7,948,033 B2 | 5/2011 | Hossain et al. | |
| 2005/0242411 A1 * | 11/2005 | Tso | 257/480 |
| 2006/0180858 A1 * | 8/2006 | Loechelt et al. | 257/341 |
| 2008/0185643 A1 * | 8/2008 | Hossain | 257/342 |
| 2010/0163846 A1 * | 7/2010 | Yilmaz et al. | 257/24 |
| 2010/0314659 A1 * | 12/2010 | Yilmaz et al. | 257/139 |
| 2011/0233635 A1 * | 9/2011 | Grivna et al. | 257/306 |
| 2012/0187526 A1 * | 7/2012 | Roig-Guitart et al. | 257/509 |
| 2012/0187527 A1 * | 7/2012 | Guitart et al. | 257/509 |
| 2012/0276701 A1 * | 11/2012 | Yedinak et al. | 438/270 |
| 2013/0015494 A1 * | 1/2013 | Yilmaz et al. | 257/139 |
| 2013/0210205 A1 * | 8/2013 | Lin et al. | 438/274 |

OTHER PUBLICATIONS

L. Theolier et al., "A new junction termination technique: the Deep Trench Termination (DT2)", ISPSD 2007, Copyright 2009 IEEE, pp. 176-179.

* cited by examiner

*Primary Examiner* — Jarrett Stark
*Assistant Examiner* — Mohammad M Hoque
(74) *Attorney, Agent, or Firm* — Noon Intellectual Property Law, P.C.

(57) ABSTRACT

In one embodiment, the semiconductor devices relate to using one or more super junction trenches for termination.

19 Claims, 11 Drawing Sheets

SEMICONDUCTOR DEVICES AND METHOD OF MAKING THE SAME

BACKGROUND

This disclosure relates in general, to electronics, and more particularly though not exclusively, to semiconductors, structures thereof, and methods of forming semiconductor devices.

Two major parameters which can be important to the high voltage power switch market are breakdown voltage (BV) and on-state resistance (RS). In typical systems a high breakdown voltage is desired. However, this is often at the expense of high RS. A trade-off in performance which accompanies balancing a high breakdown voltage and a high RS is a major design challenge for manufacturers of high voltage power switching devices. An edge termination structure that surrounds a semiconductor device aids in the reduction of electric fields at the edge of the semiconductor device (edge electric fields). Some edge termination structures can include superjunctions separated by insulating pillars, which can be referred to as superjunction trenches. However, such superjunction trenches typically prevent depletion from advancing further into the termination area.

Accordingly, it is desirable to have superjunction trenches that provide improved charge depletion properties.

BRIEF DESCRIPTION OF THE DRAWINGS

Embodiments of present disclosure will become more fully understood from the detailed description and the accompanying drawings, which are not intended to limit the scope of the present disclosure.

Figure 1A:
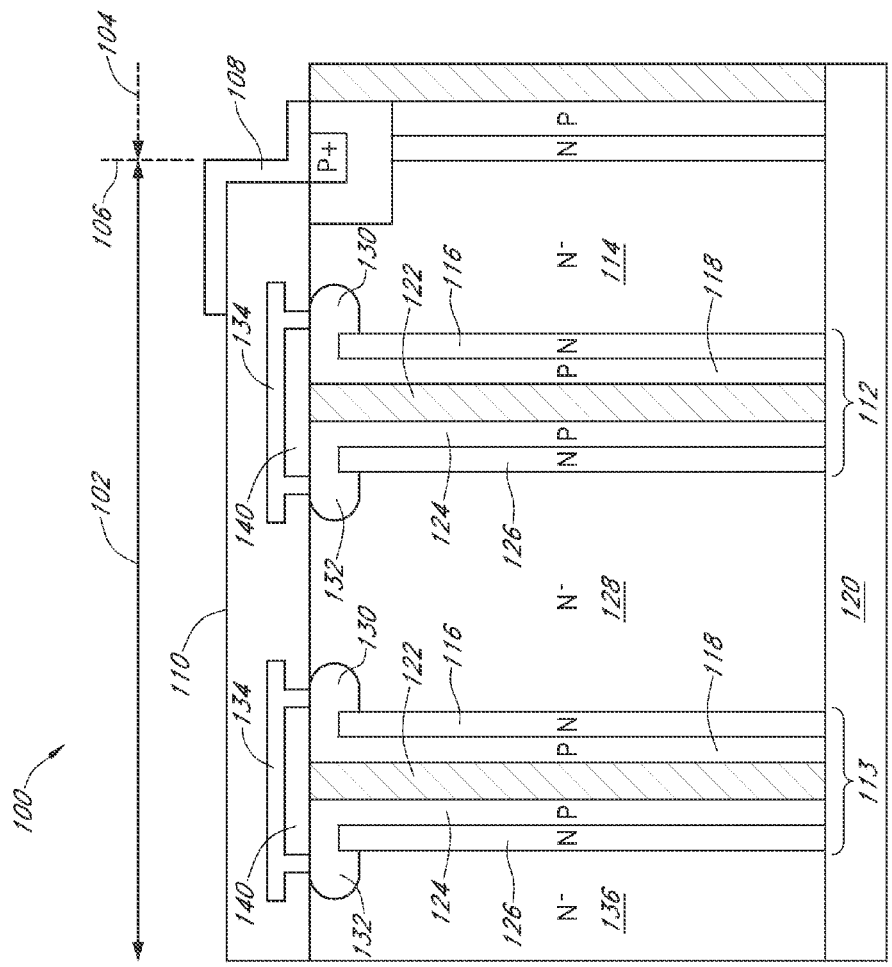
FIG. 1A is a partial, cross-sectional view of one example of a semiconductor device in accordance with an embodiment of the present disclosure.

For simplicity and clarity of the illustration, elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible. It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of a duration of the initiating action. The use of the word "approximately" or "substantially" means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and inactive means an inactive state of the signal. The actual voltage value or logic state (such as a "1" or a "0") of the signal depends on whether positive or negative logic is used. Thus, "asserted" can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms "first", "second", "third" and the like in the Claims or/and in the Detailed Description of the Drawings, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION

The present description includes, among other features, a semiconductor device that has, among other features, a termination area having super junction trenches with conductive regions that provide improved charge depletion.

Processes, techniques, apparatuses, and materials as known by one of ordinary skill in the art may not be discussed in detail but are intended to be part of the enabling description where appropriate. For example specific methods of semiconductor formation may not be listed for achieving each of the steps discussed; however one of ordinary skill would be able, without undo experimentation, to establish the steps using the enabling disclosure herein. For example, semiconductor structures can be formed by various processes including but not limited to deposition processes, removal processes, patterning processes, and processes that modify the electrical properties. Non-limiting examples of deposition processes include physical vapor deposition (PVD), chemical vapor deposition (CVD), electrochemical deposition (ECD), molecular beam epitaxy (MBE) and atomic layer deposition (ALD). Removal processes include any process that removes material either in bulk or selectively, some non-limiting example of which are etch processes, either wet etching or dry etching and chemical-mechanical planarization (CMP). Patterning includes processes that shape or alter the existing shape of the deposited materials for example lithography. Modification of electrical properties includes doping. Non-limiting examples of doping processes can include rapid thermal annealing (RTA) and modification of dielectric constants in low-k insulating materials via exposure to ultraviolet light in UV processing (UVP).

Although the devices may be explained herein as certain conductivity types such as N-type or P-type, or described as certain N-channel or P-Channel devices, or certain N-type or P-type doped regions, a person of ordinary skill in the art will appreciate that complementary devices are also possible. For example the regions can be of various conductivity types, such as N-type or P-type, and various values of resistivity or conductivity, such as N+, N−, P+, P−, N, and P, and can also be formed by other than doping processes as known by one of ordinary skill.

Additionally some embodiments of an edge termination structure disclosed herein can be combined with any semiconductor device, for example IGBTs, Junction-Schottky diodes, Silicon-on-Insulator (SOI) devices, and Thyristors.

FIG. 1 is a partial, cross-sectional view of one example of a semiconductor device in accordance with an embodiment of the present disclosure. FIG. 1 illustrates a semiconductor device 100, including termination area 102 and active region 104. Edge 106 of active region 104 borders termination area 102. Active region 104 includes source electrode 108 contacting source active cells and dielectric 110. In some embodiments, electrode 108 extends into termination area 102, but it may not extend into termination area 102 in other embodiments. Electrode 108 can be any conductive material, such as a metal. Super junction trench 112 and super-junction trench 113 each include several pillars or layers formed vertically in the termination area (e.g., an epitaxy layer). Super-junction trench 112 and super-junction trench 113 can each have various combinations of conductivity types (e.g., N type, P type) for example NP-buffer-PN or PN-buffer-NP In some embodiments, the buffer may be a dielectric (e.g., a metal oxide), a void, or combinations thereof. The NP-buffer-PN or PN-buffer-NP pillar structures may facilitate depletion. The depletion front from active region 104 passes through epitaxial layer 114 and reaches the Pwell region 130 (e.g., a first pwell region of the $1^{st}$ termination trench) at a given applied voltage (e.g., 100V), and consequently biasing and depleting the pwell and P-pillar on the both sides of the trench (pwell regions of 130 and 132, and P-pillar regions of 118 and 124) through the conductive region 134. This also helps to deplete the N-type pillar regions, and the N-epi on both sides of the trench. As the voltage is further increased, the depletion front extends out and subsequently biases and depletes the similar regions of the next trench, and follows on until the desired breakdown voltage is reached (e.g. 800V). When first region 116 is depleting, second region 118 may also be depleting. In some embodiments, first region 116 and second region 118 have a different conductivity type.

Buffer region or layer 122 (e.g., an insulator layer, an intrinsic layer, an oxide layer, a gas region, a dielectric layer, a void, or a combination of layers and regions) can be positioned between second region 118 and third region 124 (e.g., a P-type pillar). During the process of depletion, the electrostatic potential lines can extend into buffer region 122.

Third region 124 is between buffer region 122 and fourth region 126 (e.g., an N-type region). In some embodiments, third region 124 has a different conductivity type than fourth region 126. Fourth region 126 is adjacent to region 128 which may have a different conductivity type than epitaxial layer 114, or have the same conductivity type as epitaxial layer 114. In some embodiments, region 128 can be an extension of epitaxial layer 114, and thus the same conductivity, in which super junction trench 112 has been formed. Note in the non-limiting examples discussed, the regions (e.g., first region 116, second region 118, third region 124, and fourth region 126) can have various conductivity types (e.g., N-type and P-type) which can be acquired by methods known by those of ordinary skill in the semiconductor fabrication, for example by doping. Note that one region (e.g., first region 116) can also be distinguished by another region (e.g., second region 118) by different values of conductivity.

Second region 118 includes first p-well region 130 which is adjacent to dielectric 110 and epitaxial layer 114. Meanwhile, third region 124 includes second p-well region 132 which is adjacent to dielectric 110 and region 128. Conductive region 134 extends between dielectric layer 110 and dielectric region 140, and electrically couples first p-well region 130 and second p-well region 132. Conductive region 134 can be, for example, a metal or polysilicon. Thus, as shown, second region 118 and third region 124 are shorted via first p-well region 130, second p-well region 132, and conductive region 134. Thus, when second region 118 is depleting, third region 124 may also be depleting, and therefore, depletion can occur on both sides of super junction trench 112. The depletion may further advance through region 128 and across super junction trench 113. Accordingly, the super junction trenches are configured so that depletion can occur over two or more super-junction trenches. Also, without being bound to any particular theory, it is believed that p-well region 130 and p-well region 132 may screen high electric fields formed near the top of first region 116 and fourth region 126.

In some embodiments, electrode 108 and conductive region 134 may include the same conductive material, such as a metal or polysilicon. Both electrode 108 and conductive region 134 may optionally be formed during the same process step, or at about the same time, when making the semiconductor device. Dielectric region 140 may also be the same or different material than dielectric layer 110. For example, dielectric region 140 and dielectric layer 110 may both be silica.

In some embodiments, the super junction trenches can include n-well regions electrically coupled to the second region and the third region. For example, the super junction trench may have a PN-buffer-NP configuration, where the second region and the third region both have N-type conductivity and each include n-well regions that are electrically coupled by a conductivity region.

Super junction trench 113 also includes second region 118 and third region 124 which are shorted so that depletion may also advance to region 136. Region 136 may have the same or different conductivity type as epitaxial layer 114. In some embodiments, region 136 and region 128 can both be an extension of epitaxial layer 114, and thus the same conductivity, in which super junction trench 112 and super junction trench 113 have been formed.

The super junction trenches may, in some embodiments, include a conductive region that extends through the buffer region rather than the dielectric layer. As an example, conductive region 134 may extend through buffer region 122 to electrically couple second region 118 and third region 124. The conductive region may be formed, for example, by filling the top of a trench containing the buffer region with a conductive material, such as a metal, polysilicon or silicon epi plug. Furthermore, the p-well regions in the super junction trenches (e.g., p-well region 130 and p-well region 132 in super-junction trench 112) are optional, and therefore, in some embodiments, the super-junction trenches do not include p-well regions.

Figure 7A:
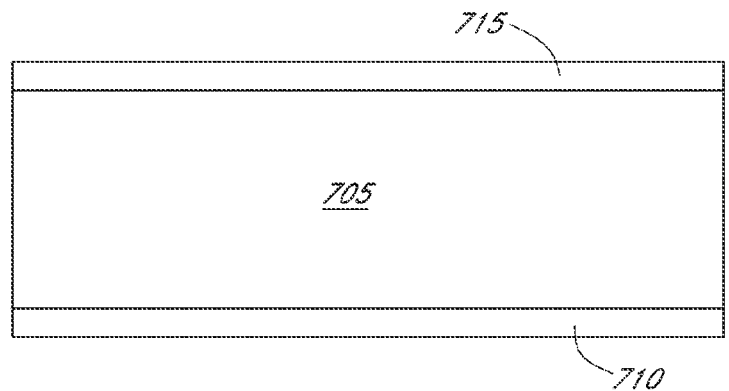
FIGS. 7A-G depict a non-limiting example of a process for making a super-junction trench in accordance with an embodiment of the present disclosure.
Figure 7B:
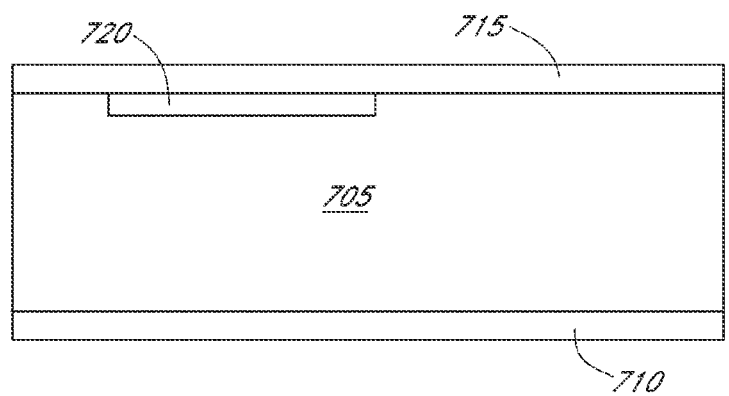
Figure 7C:
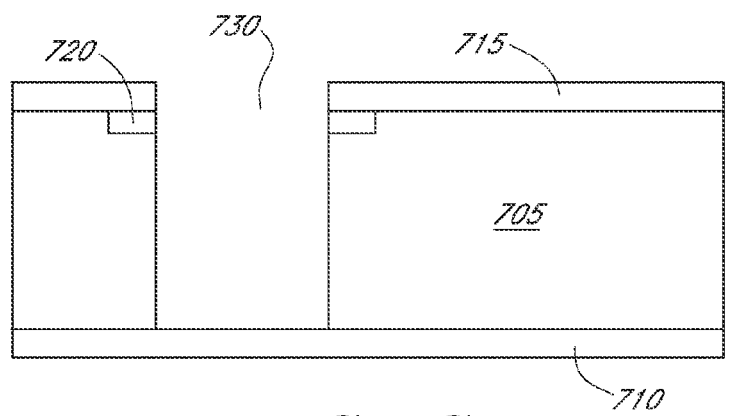
Figure 7D:
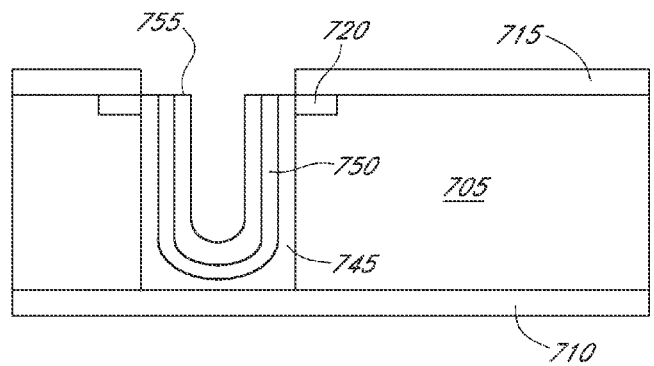
Figure 7E:
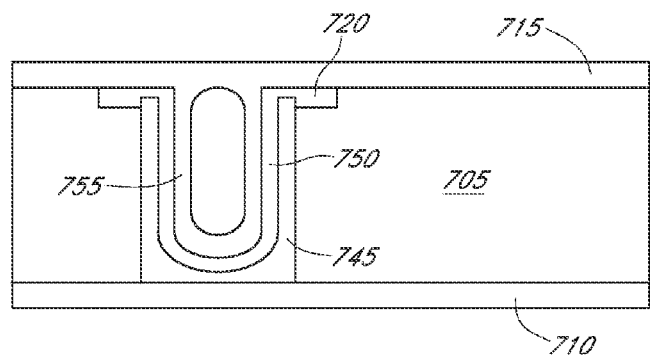
Figure 7F:
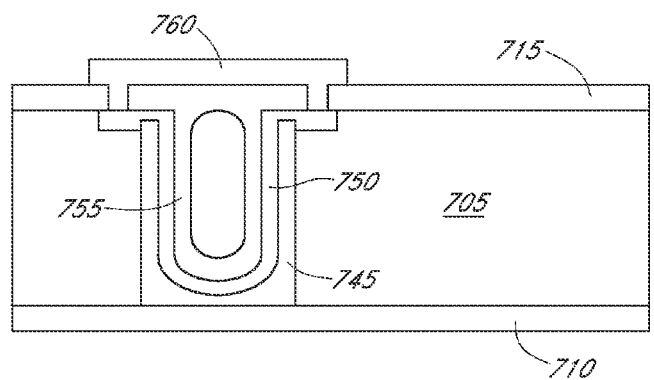
Figure 7G:
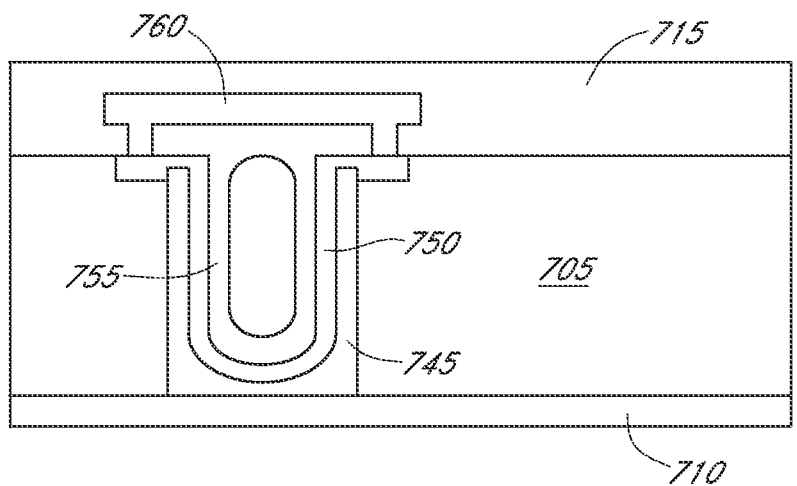

In some embodiments, the first semiconducting region and the fourth semiconducting region are formed from a common layer (e.g., first doped layer 745 forms the first semiconducting region and the second semiconducting region as depicted in FIG. 7G). In some embodiments, the second semiconducting region and the third semiconducting region are formed from a common layer (e.g., second doped layer 750 forms the first region and the second region as depicted in FIG. 7G).

Figure 1B:
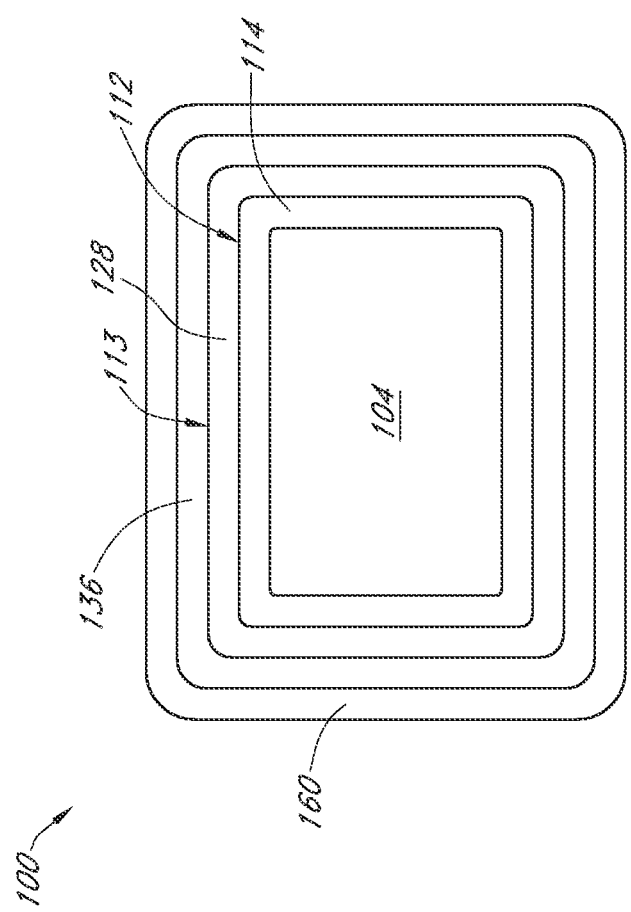
FIG. 1B is an enlarged plan view of the semiconductor device depicted in FIG. 1A.

FIG. 1B is an enlarged plan view of the semiconductor device depicted in FIG. 1A. Semiconductor device 100 includes semiconductor die 160 having active region 104 formed thereon. Super junction trench 113 and super junction trench 112 each form closed ring structures that surround active region 104.

The semiconductor devices may, in some embodiments, include two or more super-junction trenches (e.g., two, three, four, five, six, or more super-junction trenches) having a second region and a third region that are shorted (e.g., second region 118 and third region 124 in super-junction trench 112 as depicted in FIG. 1A). Thus, the semiconductor devices can have a depletion region that extends over multiple super-junction trenches. In some embodiments, an epitaxial layer is disposed between each pair of the super junction trenches. The skilled artisan, guided by the teachings of the present disclosure, will appreciate that the number and spacing between the super junction trenches can be modified to adjust the depletion characteristics of the termination area. For example, the spacing between super junction trench 112 and super junction trench 113 may be modified to adjust depletion characteristics. In some embodiments, the distance between adjacent trenches can be about 5 to 20 microns. The distance between adjacent trenches may vary. For example, the distance between adjacent trenches may increase as the approach the edge of the die. In some embodiments, the super junction trenches comprise pillars (e.g., first semiconducting region 116, second semiconducting region 118, buffer region 122, third semiconducting region 124, and fourth semiconducting region 126 in super junction trench 112) that each have a width of about 0.1 μm to about 10 μm, or about 0.2 μm to about 2 μm.—Note that buffer regions can include several types of layers of dielectrics and insulators. For example, buffer region 122 can include an oxide layer and a gas region. The pillars or buffer regions in each super junction trench may be in the same or different relative to other super-junction trenches in the termination area.

Note that discussions herein may refer to a layer or a region where a layer is a specific type of region, generally formed parallel to a surface. A region can be of any shape of formation. Thus, although some non-limiting examples discuss layers, the scope of such embodiments should be interpreted to extend to also include regions. Note that the super-junction trench (e.g., super junction trench 112) can be operatively attached to the epitaxial layer (e.g., epitaxial layer 114), where operatively attached includes formed in and/or adjacent to the epitaxial layer.

Figure 2:
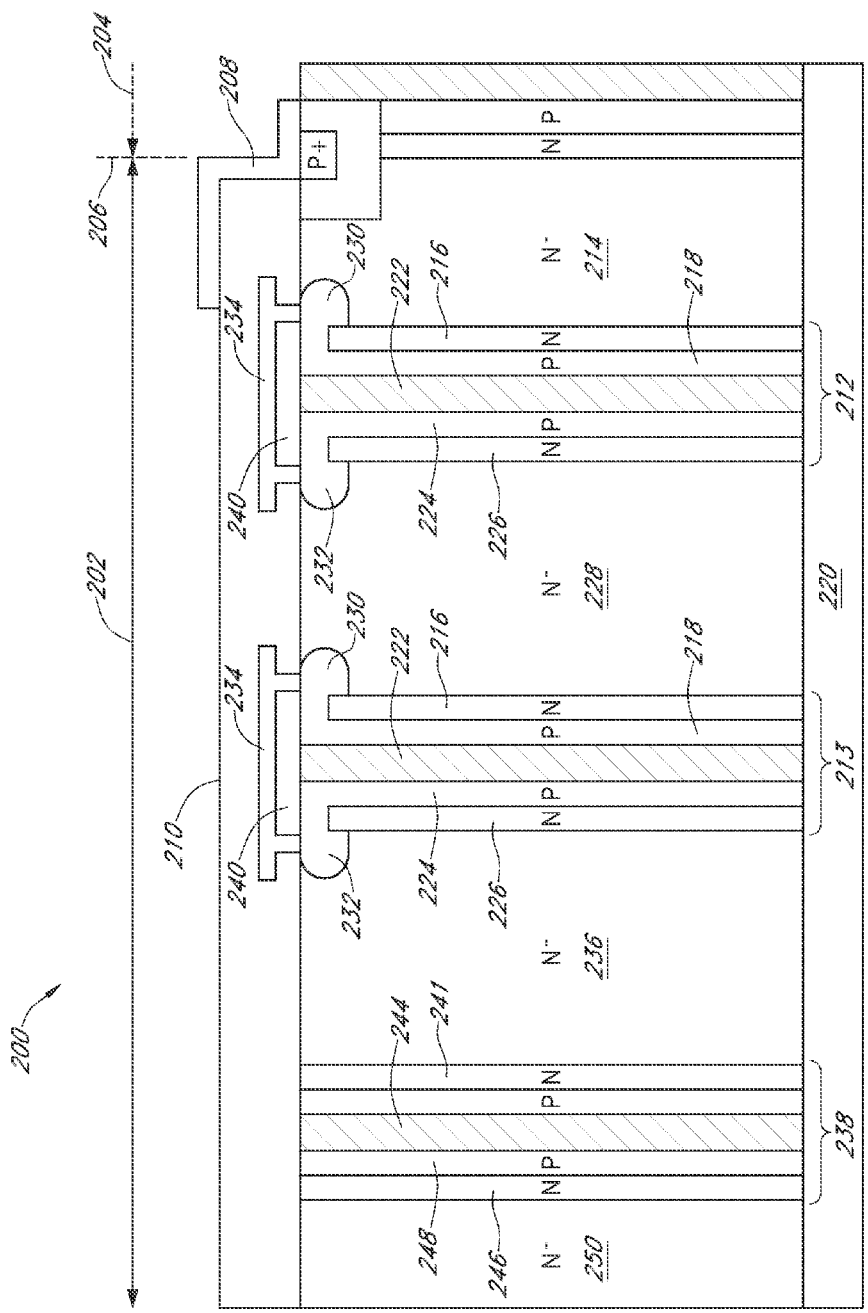
FIG. 2 is a partial, cross-sectional view of one example of a semiconductor device in accordance with an embodiment of the present disclosure.

FIG. 2 is a partial, cross-sectional view of one example of a semiconductor device in accordance with an embodiment of the present disclosure. Semiconductor device 200 includes generally the same structures as semiconductor device 100 depicted in FIG. 1. Consequently, features 202-240 depicted in FIG. 2 correspond to features 102-140 depicted in FIG. 1. For example, super-junction trench 212 and super-junction trench 213 have the same characteristics as super-junction trench 112 and super junction trench 113, respectively.

Semiconductor device 200 also includes super junction trench 238 having first semiconducting region 241, second semiconducting region 242, buffer region 244, third semiconducting region 246, and fourth semiconducting region 248. Super junction trench 238 can have various combinations of conductivity types (e.g., N type, P type) for example NP-buffer-PN or PN-buffer-NP. In some embodiments, the buffer may be a dielectric (e.g., a metal oxide), a void, or combinations thereof. The NP-buffer-PN or PN-buffer-NP pillar structures may facilitate depletion. Super junction trench 238 does not include a conductive region that electrically couples second region 242 and third region 246 (e.g., does not include conductive region 234 in super junction trench 213). Thus, in some embodiments, second region 242 is insulated from third region 246. Semiconductor device 200 may therefore be configured so that depletion may advance across super-junction trench 212 and super junction trench 213 via conductive region 234, but depletion across super junction trench 238 may be diminished (or preventing the field from spreading beyond the buffer region) because second region 242 is insulated from third region 246. Semiconductor device 200 may therefore, in some embodiments, advantageously prevent or reduce an electric field near an edge of semiconductor device 200.

Region 250 in semiconductor device 200 can have the same or different conductivity type a region 236, region 228, and epitaxial layer 214. In some embodiments, region 250, region 236, and region 228 can each be an extension of epitaxial layer 214, and thus the same conductivity, in which super-junction trench 212, super junction trench 213, and super-junction trench 238 have been formed.

The semiconductor devices may, in some embodiments, include one or more (e.g., one, two, three, four, five, six, or more) super junction trenches having a second semiconducting region that is shorted to a third semiconducting region (e.g., super junction trench 212 and super-junction trench 213 as depicted in FIG. 2) and one or more (e.g., one, two, three, four, five, six, or more) super junction trenches having a second semiconducting region that is insulated from a third semiconducting region (e.g., super junction trench 238 as depicted in FIG. 2). The super-junction trenches having a second semiconducting region that is shorted to a third semiconducting region can be between the active region and the super junction trenches having a second semiconducting region that is insulated from a third semiconducting region. For example, super-junction trench 212 and super-junction trench 213 are both between active region 204 and super-junction trench 238 as depicted in FIG. 2.

Note that doping levels in some embodiments can vary. As a non-limiting example, N doped and P doped regions can have concentrations on the order of about $1 \times 10^{13}$ to about $1 \times 10^{18}$ atoms/cm$^3$, and more particularly concentrations on the order of $1 \times 10^{15}$ to about $1 \times 10^{17}$ atoms/cm$^3$. Intrinsic layers are undoped or lightly doped regions with a dopant concentration less than about $2 \times 10^{14}$ atoms/cm$^3$. Additionally the intrinsic layer thickness can vary, for example between about fifty (50) nanometers and about two (2) microns. Additionally although the first, second, and third conductivity types (N-type and P-type) can be obtained via doping, other methods as known by one of ordinary skill in the art of semiconductor fabrication can be used to obtain regions of various N and P conductivity types by other methods.

Figure 3:
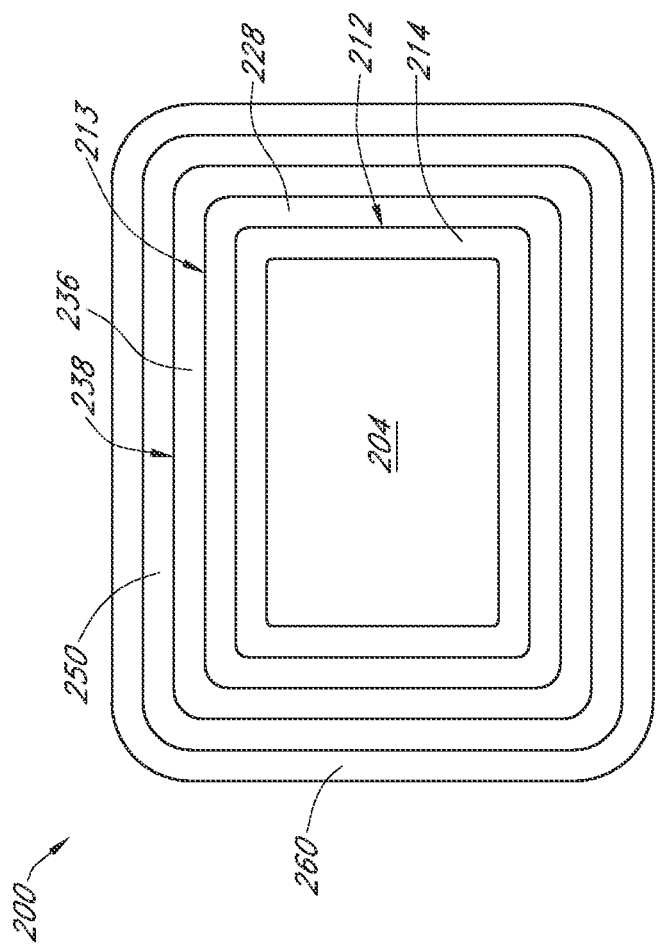
FIG. 3 is an enlarged plan view the semiconductor device depicted in FIG. 2.

FIG. 3 is an enlarged plan view of semiconductor device 200 depicted in FIG. 2. Semiconductor device 200 includes semiconductor die 260 having active region 204 formed on semiconductor die 260. Super-junction trench 238, super junction trench 212, and super-junction trench 213 each form closed ring structures that surround active region 104.

Figure 4:
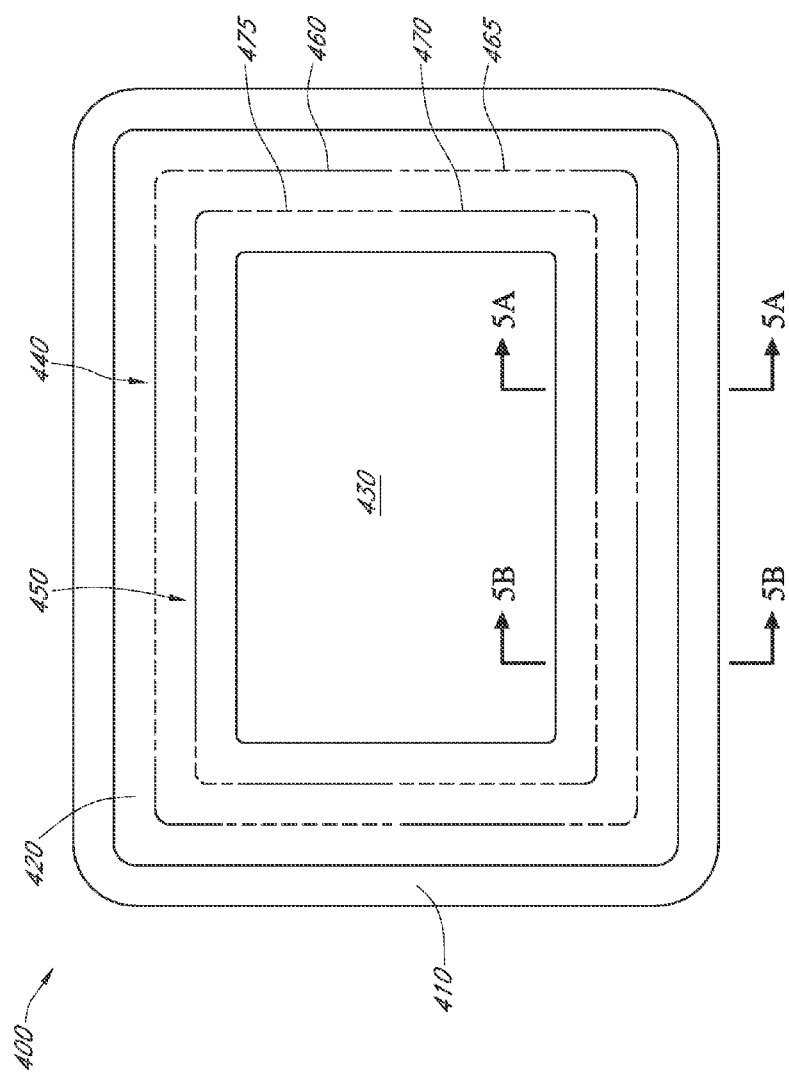
FIG. 4 is an enlarged plan view of one example of a semiconductor device.

FIG. 4 is an enlarged plan view of one example of a semiconductor device. Semiconductor device 400 includes semiconductor die 410 having termination area 420 and active region 430. Termination area 420 includes ring structure 440 and ring structure 450, which both surround active region 430. Ring structure 440 includes first segment 460 and second segment 465, which are alternatively arranged to form ring structure 440 which surrounds ring structure 450 and active region 430. Ring structure 450 includes first segment 470 and second segment 475, which are alternatively arranged to form ring structure 450 which surrounds active region 430.

Figure 5A:
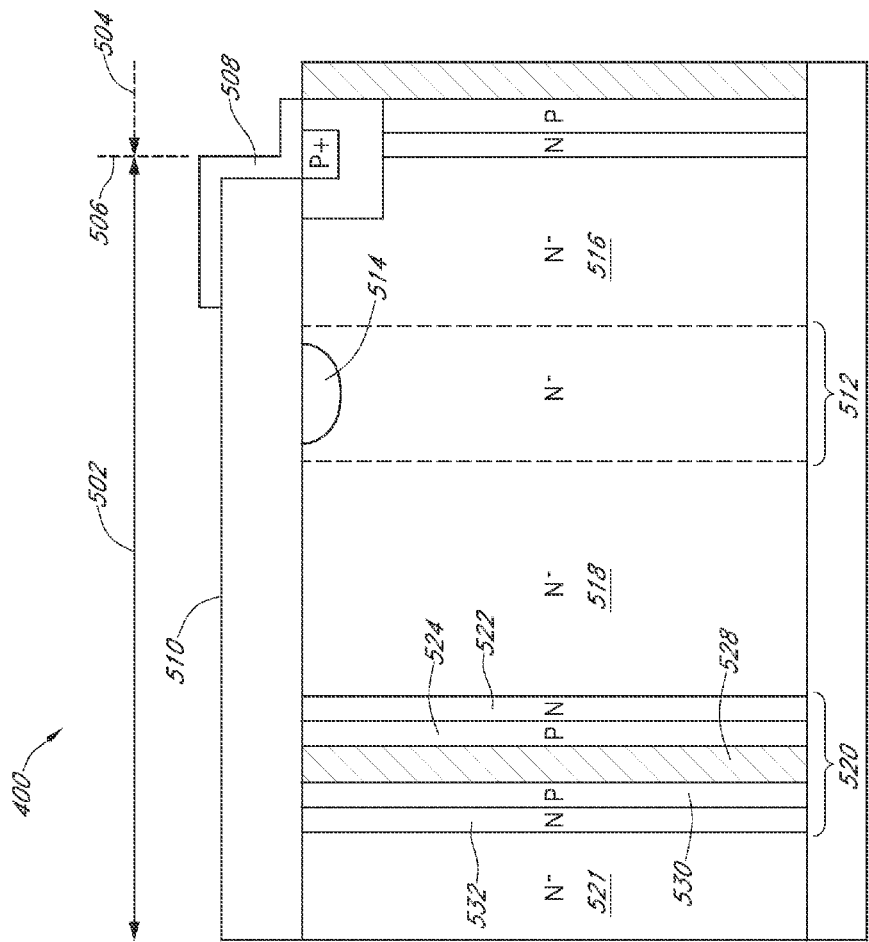
FIG. 5A is a cross-sectional view of one example of region 480 of semiconductor device 400 as depicted in FIG. 4.

FIG. 5A is a cross-sectional view of one example of region 480 of semiconductor device 400 as depicted in FIG. 4. Semiconductor device 400 includes structures 502-510, which can be the same as structures 102-110 in FIG. 1, respectively. Region 512 includes p-well region 514 and is between epitaxial layer 516 and region 518. As will be discussed further below, region 512 is a cross-section of second segment 475 of ring structure 450. Meanwhile, region 518 can have the same or different conductivity type as epitaxial layer 516. In some embodiments, region 518 can be an extension of epitaxial layer 514, and thus the same conductivity. Similarly, region 512 may be an extension of epitaxial layer 514, and thus the same conductivity, in which p-well region 514 has been formed.

Super junction trench 520 is between region 518 and region 521. Super-junction trench 520 can have generally the same characteristics as super junction trench 238 as depicted in FIG. 2. Accordingly, first semiconducting region 522, second semiconducting region 524, buffer region or layer 528, third semiconducting region 530, and fourth semiconducting region 532 may have the same characteristics as first semiconducting region 240, second semiconducting region 242, buffer region or layer 244, third semiconducting region 246, and fourth semiconducting region 248, respectively. As an example, super junction trench 520 can have various combinations of conductivity types (e.g., N type, P type) for example NP-buffer-PN or PN-buffer-NP. Super junction trench 520 has second region 524 insulated from third region 530 and does not include a conductive region that electrically couples second region 524 and third region 530. As will be discussed further below, super-junction trench 520 is a cross-section of first segment 460 of ring structure 440. Region 521 in semiconductor device 400 can have the same or different conductivity type as region 518, and epitaxial layer 516. In some embodiments, region 518 and region 521 can each be an extension of epitaxial layer 516, and thus the same conductivity, in which super-junction trench 520 and p-well region 514 are formed.

Figure 5B:
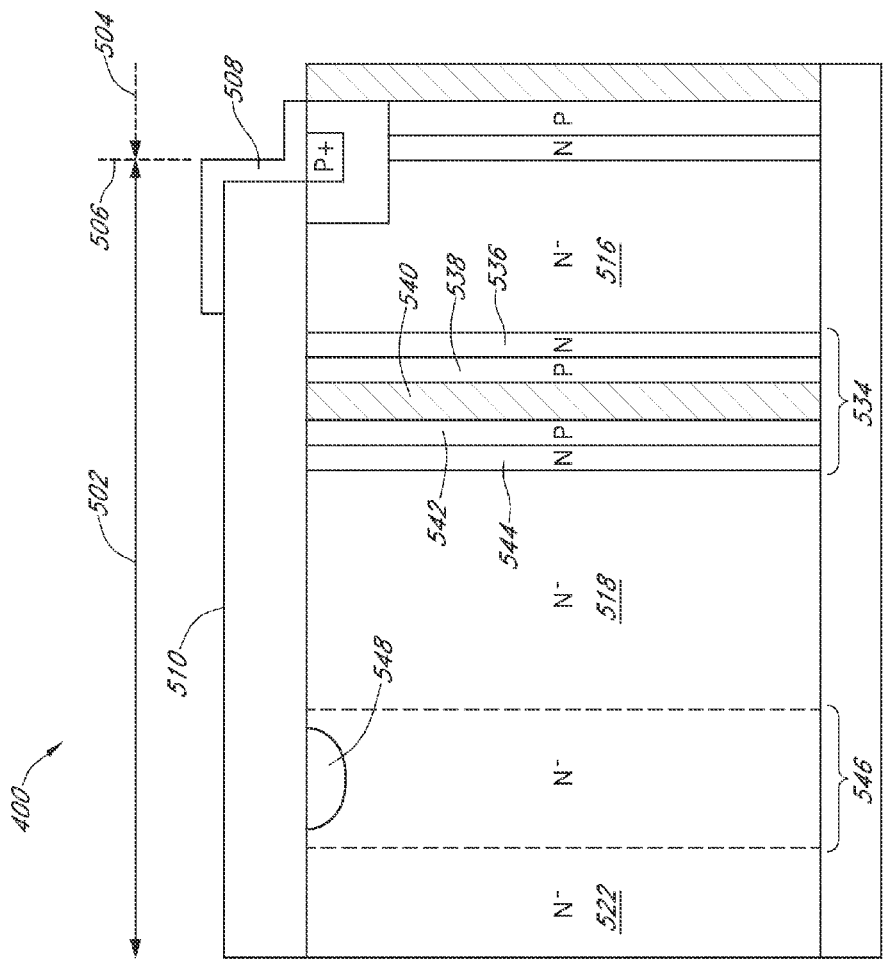
FIG. 5B is a cross-sectional view of one example of region 490 of semiconductor device 400 as depicted in FIG. 4.

FIG. 5B is a cross-sectional view of one example of region 490 of semiconductor device 400 as depicted in FIG. 4. Super junction trench 534 is between epitaxial layer 516 and region 518. Super-junction trench 534 can have generally the same characteristics as super-junction trench 238 as depicted in FIG. 2. Accordingly, first semiconducting region 536, second semiconducting region 538, buffer region or layer 540, third semiconducting region 542, and fourth semiconducting region 544 may have the same characteristics as first semiconducting region 240, second semiconducting region 242, buffer region or layer 244, third semiconducting region 246, and fourth semiconducting region 248, respectively. Super junction trench 534 may have the same or different configuration as super junction trench 520. As an example, super-junction trench 534 may have a NP-buffer-PN configuration, while super junction trench 520 may have a PN-buffer-NP configuration. As another example, super junction trench 534 and super-junction trench 520 may both have NP-buffer-PN configuration.

Super junction trench 534 corresponds to first segment 470 in ring structure 450 of semiconductor device 400. Thus, super junction trench 534 as depicted in FIG. 5B and region 512 as depicted in FIG. 5A are alternatively arranged to form ring structure 450. P-well region 514 can be adjacent to second region 538 and third region 542 of super junction trench 534 at each interface between first segment 470 and second segment 475 in ring structure 450. P-well region 514 may therefore electrically couple second region 538 and third region 542 of super-junction trench 534 at each interface between first segment 470 and second segment 475 in ring structure 450. Accordingly, charge depletion can advance from active region 430 to second region 538 in super junction trench 534 and then along ring structure 450 (e.g., perpendicular to the cross-sectional view in FIG. 5B) to p-well region 514 so that depletion may advance passed buffer region 540. Meanwhile, charge depletion may also directly advance from active region 430 through region 512 without advancing through second region 538.

Region 546 includes p-well region 548 and is between region 518 and region 521. Region 546 can, in some embodiments, be an extension of epitaxial layer 516 in which p-well region 548 is formed. Region 546 corresponds to second segment 465 in ring structure 440 of semiconductor device 400. Thus, region 546 as depicted in FIG. 5B and super-junction trench 520 as depicted in FIG. 5A are alternatively arranged to form ring structure 440. P-well region 548 can be adjacent to second semiconducting region 524 and third semiconducting region 530 of super junction trench 520 at each interface between first segment 460 and second segment 455 in ring structure 440. P-well region 548 may therefore electrically couple second semiconducting region 524 and third semiconducting region 530 of super junction trench 520 at each interface between first segment 460 and second segment 465 in ring structure 440. Accordingly, charge depletion can advance from ring structure 450 to second region 524 in super junction trench 520 and then along ring structure 440 (e.g., perpendicular to the cross-sectional view in FIG. 5A) to p-well region 548 so that depletion may advance passed buffer region 528. Meanwhile, another portion of the charge depletion may directly advance from ring structure 450 through region 546.

In some embodiments, the semiconductor device may not include p-well regions in the second segments of the ring structures. For example, referring to FIGS. 4 and 5A, region 546 in second segment 465 of ring structure 440 may not include p-well region 548, but rather region 518, region 546, and region 522 may form a continuous portion of the epitaxial layer in which super-junction trench 534 is formed. In this case, second segment 546 is a "gap" in super-junction trench 520 depicted in FIG. 5A which permits charge depletion to advance passed super-junction trench 520.

Referring again to FIG. 4, first segment 460 and first segment 470 are offset relative to each other. This may prevent a straight path for charge depletion from active region 430 to the edge of termination area 420. Rather, this configuration requires a path that includes advancing parallel to first segment 460 and/or first segment 470 which both include super-junction trenches.

Figure 6:
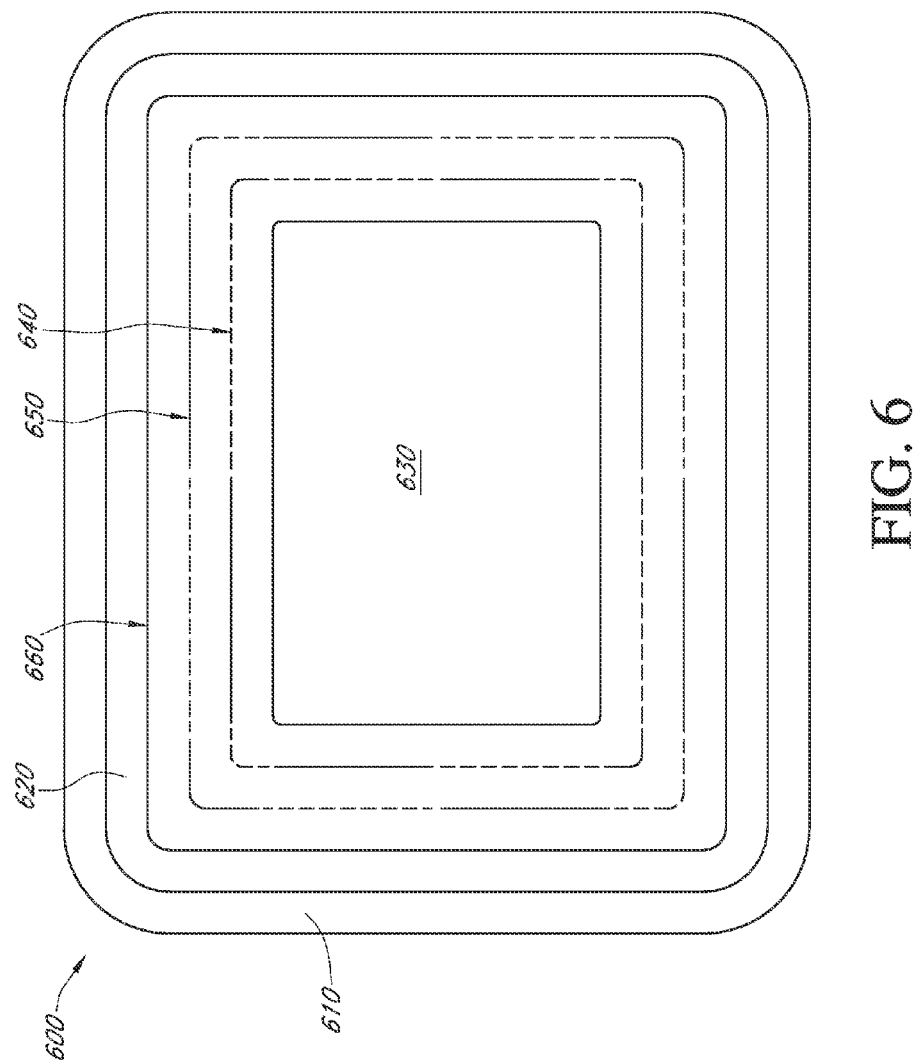
FIG. 6 is an enlarged plan view of one example of a semiconductor device.

FIG. 6 is an enlarged plan view of one example of a semiconductor device. Semiconductor device 600 includes semiconductor die 610 having termination area 620 and active region 630. Termination area 620 includes ring structure 640, ring structure 650, and ring structure 660, which each surround active region 630. Ring structure 640 can have the same characteristics as ring structure 450 depicted in FIG. 4. Ring structure 650 can have the same characteristics as ring structure 440 depicted in FIG. 4. Ring structure 660 can be a continuous ring (e.g., does not contain different segments) formed by a super junction trench. In some embodiments, the super junction trench has the same characteristics as super junction trench 238 depicted in FIG. 2. That is, the super junction trench includes a second semiconducting region that is insulated from a third semiconducting region. Ring structure 660 may therefore prevent or greatly diminish charge depletion advancing to the edge of termination area 620. Alternatively, in some embodiments, the super junction trench in ring structure 660 has the same characteristics as super-junction trench 113 depicted in FIG. 1.

The skilled artisan, guided by the teachings of the present disclosure, will appreciate that various combinations and types of continuous ring structures (e.g., ring structure 660 as depicted in FIG. 6) and segmented ring structures (e.g., ring structure 440 as depicted in FIG. 4) can be selected to modulate the depletion properties of the termination area. For example, the continuous ring structures can each independently have (i) a super junction trench having the second region insulated from the third region (e.g., super junction trench 238 as depicted in FIG. 2) or (ii) a super junction trench having the second region electrically coupled to the third region (e.g., super junction trench 112 depicted in FIG. 1). The termination area may include one, two, three, or more continuous ring structures that may be the same or different. Similarly, the segmented ring structures can each independently include two or more (e.g., two, three, four, or more) segments types that include at least two of: (i) a super junction trench having the second semiconducting region insulated from the third semiconducting region (e.g., super-junction trench 238 as depicted in FIG. 2); (ii) a super-junction trench where the second semiconducting region is electrically coupled to the third semiconducting region (e.g., super-junction trench 112 depicted in FIG. 1); (iii) a region having a p-well region (e.g., region 512 as depicted in FIG. 5A); and (iv) a "gap" in the ring structure (e.g., region 512 as depicted in FIG. 5A but without p-well region 514). The termination area may include one, two, three, four, five, six, or more segmented ring structures that may be the same or different. Furthermore, the relative length and number of the segments may also be adjusted to modulate the depletion properties of the termination area.

Some embodiments disclosed herein include a method for making a semiconductor edge termination structure. The method may be used, for example, to form the super-junction trenches disclosed in the present disclosure (e.g., super-junction trench 112 depicted in FIG. 1).

FIGS. 7A-J depict a non-limiting example of a process for making a super-junction trench in accordance with an embodiment of the present disclosure. Those skilled in the art will appreciate that the method steps disclosed herein are one example of a method and that variations of the method may be used. FIG. 7A shows doped semiconductor layer 705 (e.g. N-doped epitaxy layer) formed on doped (e.g., N+ doped) semiconductor substrate 710. Dielectric layer 715 can be formed on doped semiconductor layer. First doped region 720 having a first conductivity can be selectively formed as shown in FIG. 7B. First doped region 720 may, for example, have a p-type conductivity and be formed by ion implantation.

Referring to FIG. 7C, first recess 730 (e.g., a first trench) can be etched into semiconductor layer 705 using known semiconductor etching techniques. The vertical extent of the trench can reach semiconductor substrate 710, the semiconductor layer 705, or into a buffer region (not shown). First doped layer 745 having a second conductivity can be formed on, over, or adjoining the surface of recess 730 as shown in FIG. 7D. In some embodiments, the conductivity of first doped layer 745 is different than the conductivity of first doped region 720. As an example, first doped region 720 can have a p-type conductivity, while first doped layer 745 can have an n-type conductivity. First doped layer 745 can be formed, for example, using conventional selective epitaxial growth techniques. In some embodiments, a selective etching process, such as dry etching, may be used to divide first doped layer 745 into separate pillars on each side of recess 730 (not shown).

Second doped layer 750 having a third conductivity can be formed on, over, or adjoining the surface of first doped layer 745. In some embodiments, the conductivity of second doped layer 750 can be the same as the conductivity of first doped region 720. For example, first doped region 720 and second doped layer 750 can both have a p-type conductivity. Second region 750 can be formed, for example, using conventional selective epitaxial growth techniques. In some embodiments, a selective etching process may be used to divide second doped layer 750 into separate pillars on each side of recess 730 (not shown).

Dielectric layer 755 can be formed on, over, or adjoining the surface of second doped layer 750. In some embodiments, dielectric layer 755 may substantially fill the region between second doped layer 750 and recess 730 (not shown).

As shown in FIG. 7E, second doped layer 750 can be electrically connected to first doped region 720 on both sides of recess 730. For example, first doped region 720 and second doped layer 750 may both have the same conductivity type (e.g., p-type). Regions between first doped region 720 and second doped layer 750 can be passivated and doped using, for example, wet oxidation and ion implantation. A dielectric cap may be formed over recess 730 and the surface of the dielectric cap and dielectric layer 715 planarized.

In some embodiments, a conductive cap or region having, for example, a metal or polysilicon, can be used to cap recess 730 (not shown). The conductive cap may electrically couple first doped region 720 on both sides of first doped layer 745.

Conductive region 760 may be formed on dielectric layer 715 and configured to electrically couple first doped region 720 on both sides of recess 730 as shown in FIG. 7F. For example, dielectric layer 715 can be etched to expose first doped region 720 on both sides of first doped layer 745. Conductive layer 760 can then be formed using, for example, chemical vapor deposition. Additional dielectric material can be applied on conductive layer 760 and the surface planarized as shown in FIG. 7G. In some embodiments, the method does not include forming conductive region 760 (e.g., in some embodiments including a conductive cap).

The skilled artisan, guided by the teachings of the present disclosure, will appreciate that the various operations disclosed for the method of forming the termination structure may be performed in a different order and some operations may be performed at about the same time.

From all the foregoing one skilled in the art can determine that according to one embodiment, a semiconductor device comprises a semiconducting device. The semiconducting device may, in some embodiments, include a semiconductor substrate of a first conductivity type and a first semiconducting layer of the first conductivity type overlying the semiconductor substrate.

In some embodiments, the semiconducting device includes an edge termination structure having one or more first super junction trenches. In some embodiments, the first super-junction trenches each include: a first semiconducting region; a second semiconducting region adjacent to the first semiconducting region; a first buffer region adjacent to the second semiconducting region; a third semiconducting region adjacent to the first buffer region; a fourth semiconducting region adjacent to the third region; and a first conducting region electrically coupling the second region to the third region.

In some embodiments, the first semiconducting region has a second conductivity type. In some embodiments, the second semiconducting region has a third conductivity type that is different than the second conductivity type. In some embodiments, the third semiconducting region has the third conductivity type. In some embodiments, the fourth semiconducting region has the second conductivity type.

Those skilled in the art will also appreciate that according to another embodiment of a semiconducting device having a semiconductor substrate of a first conductivity type, a first layer of the first conductivity type overlying the semiconductor substrate, an active region; and one or more ring structures surrounding the active region.

In some embodiments, the ring structures each include two or more first segments and two or more second segments. In some embodiments, each of the first segments includes a first super junction trench. In some embodiments, the first super junction trench includes: a first semiconducting region; a second semiconducting region adjacent to the first semiconducting region; a first buffer region adjacent to the second semiconducting region; a third semiconducting region adjacent to the first buffer region; and a fourth semiconducting region adjacent to the third region; and a first conducting region electrically coupling the second region to the third region.

In some embodiments, the first semiconducting region has a second conductivity type. In some embodiments, the second semiconducting region has a third conductivity type that is different than the second conductivity type. In some embodiments, the third semiconducting region has the third conductivity type. In some embodiments, the fourth semiconducting region has the second conductivity type.

In some embodiments, the second segments each include a fifth semiconducting region having the first conductivity type. In some embodiments, the first segments and the second segments are alternatively arranged to form the ring structure.

Those skilled in the art will also appreciate that according to another embodiment of a method of forming a semiconductor edge termination structure. The method may, in some embodiments, include: forming a trench in an epitaxial layer; forming a first semiconducting layer overlying a first sidewall of the trench; forming a second semiconducting layer overlying a second sidewall of the trench; forming a third semiconducting layer overlying the first semiconducting layer; forming a fourth semiconducting layer overlying the second semiconducting layer; forming a buffer layer between the third semiconducting layer and the fourth semiconducting layer; and forming a first conducting layer.

In some embodiments, the trench extends to a semiconductor substrate, and the semiconductor substrate and the epitaxial layer both have a first conductivity type. In some embodiments, a conductivity type of the first semiconducting layer is the same as a conductivity type of the second semiconducting layer. In some embodiments, a conductivity type of the third layer is different than a conductivity type of the first layer. In some embodiments, a conductivity type of the fourth semiconducting layer is different than a conductivity type of the second semiconducting layer. In some embodiments, the conductive region electrically couples the second semiconducting layer and the third semiconducting layer.

As the claims hereinafter reflect, inventive aspects may lie in less than all features of a single foregoing disclosed embodiment. Thus, the hereinafter expressed claims are hereby expressly incorporated into this Detailed Description of a non-limiting sample of embodiments, with each claim standing on its own as a separate embodiment of an invention. Furthermore, while some embodiments described herein include some but not other features included in other embodiments, combinations of features of different embodiments are meant to be within the scope of the disclosure, and form different embodiments, as would be understood by those skilled in the art. Such variations are not to be regarded as a departure from the spirit and scope of the present disclosure.

In view of the above, it is evident that a novel device and method is disclosed that can, in at least one embodiment, having a termination area with one or more super-junction trenches that provide improved charge depletion.

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A semiconductor device comprising:
   a semiconductor substrate of a first conductivity type, wherein the first conductivity type is a n-type conductivity;
   a first semiconducting layer of the first conductivity type overlying the semiconductor substrate, wherein the first semiconducting layer is an epitaxial layer; and
   an edge termination structure surrounding an active region of the semiconductor device, wherein the edge termination structure comprises one or more first super junction trenches disposed in the first semiconducting layer, wherein the first super-junction trenches each comprise:
   a first semiconducting region having a second conductivity type, wherein the second conductivity type is a n-type conductivity;

a second semiconducting region adjacent to the first semiconducting region, wherein the second semiconducting region has a third conductivity type, wherein the third conductivity type is a p-type conductivity, and wherein the second semiconducting region comprises a first p-well region that is adjacent to the first semiconducting layer;

a first buffer region adjacent to the second semiconducting region, wherein a portion the second semiconducting region is disposed between the first semiconducting region and the first buffer region;

a third semiconducting region adjacent to the first buffer region, wherein the third semiconducting region has the third conductivity type, and wherein the third semiconducting region comprises a second p-well region that is adjacent to the first semiconducting layer;

a fourth semiconducting region adjacent to the third semiconducting region, wherein the fourth semiconducting region has the second conductivity type, and wherein a portion of the third semiconducting region is disposed between the first buffer region and the fourth semiconducting region; and a first conducting region electrically coupling the second semiconducting region to the third semiconducting region, wherein the first conducting region is adjacent the first p-well region of the second semiconducting region and the second p-well region of the third semiconducting region.

2. The semiconductor device of claim 1, wherein the first buffer region comprises a dielectric material and at least one void.

3. The semiconductor device of claim 1, wherein the conducting region is adjacent to the first buffer region.

4. The semiconductor device of claim 1, wherein:
the first semiconducting region is at least partially disposed between the first p-well region and the first buffer region; and
the fourth semiconducting region is at least partially disposed between the second p-well region and the first buffer region.

5. The semiconductor device of claim 1, further comprising a dielectric layer formed on at least a portion of the first semiconducting layer.

6. The semiconductor device of claim 5, wherein the first conducting region extends through the dielectric layer.

7. The semiconductor device of claim 1, wherein the edge termination structure further comprises one or more second super junction trenches, wherein the second super-junction trenches each comprise:
a fifth semiconducting region having a fourth conductivity type;

a sixth semiconducting region adjacent to the fifth semiconducting region, wherein the sixth semiconducting region has a fifth conductivity type that is different than the fourth conductivity type;
a second buffer region adjacent to the sixth region;
a seventh semiconducting region adjacent to the second buffer region, wherein the seventh semiconducting region has the fifth conductivity type; and
an eighth semiconducting region adjacent to the seventh region, wherein the eighth region has the fourth conductivity type,
wherein the sixth region is electrically insulated from the seventh region.

8. The semiconductor device of claim 7, wherein the first super junction trenches are disposed between the second super-junction trenches and the active region of the semiconductor device.

9. The semiconductor device of claim 7, wherein the fourth conductivity type is a n-type conductivity.

10. The semiconductor device of claim 7, wherein the fifth conductivity type is a p-type conductivity.

11. The semiconductor device of claim 7, wherein the second buffer region comprises a dielectric material and at least one void.

12. The semiconductor device of claim 1, wherein the first conducting region is a metal or polysilicon.

13. The semiconductor device of claim 1, wherein the first buffer region is disposed between the first conducting region and the semiconductor substrate.

14. The semiconductor device of claim 1, wherein the first conducting region in each of the first super junction trenches are insulated from a source electrode of the semiconductor device.

15. The semiconductor device of claim 1, wherein the first conducting region is spaced apart from the first buffer region.

16. The semiconductor device of claim 1, wherein the first super junction trench is symmetric.

17. The semiconductor device of claim 1, wherein the edge termination structure comprises two or more of the first super junction trenches, and wherein a distance between the first super junction trenches is about 5 µm to about 20 µm.

18. The semiconductor device of claim 5, wherein the first p-well region of the second semiconducting region is adjacent to the dielectric layer, and wherein the second p-well region of the third semiconducting region is adjacent to the dielectric layer.

19. The semiconductor device of claim 1, wherein the first buffer layer is adjacent to the semiconductor substrate, and wherein the first buffer layer extends through an entire thickness of the first semiconducting layer.

* * * * *